| [19] | | [11] | 4,191,929 |
|---|---|---|---|
| | | [45] | Mar. 4, 1980 |

United States Patent
Max et al.

[54] ISOLATION AMPLIFIER WITH HIGH LINEARITY

[75] Inventors: Solomon M. Max, Brookline; Hans J. Weedon, Salem, both of Mass.

[73] Assignee: Analogic Corporation, Wakefield, Mass.

[21] Appl. No.: 912,730

[22] Filed: Jun. 5, 1978

[51] Int. Cl.$^2$ ............................................. H03F 3/38
[52] U.S. Cl. ....................................... 330/10; 330/75; 330/165
[58] Field of Search ........................... 330/10, 75, 165

[56] References Cited

U.S. PATENT DOCUMENTS

| 2,358,480 | 9/1944 | Skilling | 330/105 X |
|---|---|---|---|
| 2,497,129 | 2/1950 | Liston | 330/10 X |
| 3,173,096 | 3/1965 | Hinrichs et al. | 330/10 X |
| 3,466,557 | 9/1969 | Nazareth | 330/10 |
| 3,828,269 | 8/1974 | Norton | 330/165 X |
| 3,974,425 | 8/1976 | Ueda et al. | 330/165 X |

Primary Examiner—James B. Mullins
Attorney, Agent, or Firm—Weingarten, Maxham & Schurgin

[57] ABSTRACT

A transformer-coupled isolation amplifier which can accept signals over a wide dynamic range while maintaining very high linearity. An input signal is applied to an input winding of a transformer. The secondary winding of the isolation transformer is connected across the differential inputs of a high-gain amplifier. Negative feedback is provided around the amplifier so that the transformer secondary winding is connected across a virtual short; and the negative feedback tends to drive the voltage applied to the inputs of the amplifier to a very small value. The negative feedback from the amplifier induces a current in the transformer secondary which cancels the flux produced by current flowing in the primary, thereby reducing the effects of non-linearities in the BH curve of the transformer.

5 Claims, 2 Drawing Figures

FIG. I

ISOLATION AMPLIFIER WITH HIGH LINEARITY

FIELD OF THE INVENTION

This invention is related to isolation amplifiers and more particularly to transformer-coupled isolation amplifiers.

BACKGROUND OF THE INVENTION

In providing electronic instrumentation, it is frequently necessary to apply a signal from a signal source, such as a sensor or transducer, to electronic signal processing circuitry while maintaining complete electrical isolation between the signal source and the signal processing electronics. Various methods are presently used in constructing such isolation amplifiers, including transformer coupling and photoelectric coupling of the input and output circuits.

One problem with previous transformer-coupled isolation amplifiers has been non-linearity in the amplifiers due to partial saturation of the transformer core with varying input signal levels. In designing such transformer-coupled amplfiers, typically one must make a trade-off between limited dynamic range and non-linearity arising from the non-linear BH curve of a transformer as signal levels increase.

SUMMARY OF THE INVENTION

The present invention provides a transformer-coupled isolation amplifier which can accept signals over a wide dynamic range while maintaining very high linearity. The invention operates in the following manner. An input signal is applied to an input winding of a transformer. Signal sources with which isolation amplifiers are used frequently provide very low frequency signals, and a chopper or modulator circuit may be used to convert the low frequency signal to a higher frequency signal which the transformer can transmit. The secondary winding of the isolation transformer is connected via a demodulator circuit across the differential inputs to an operational amplifier. Negative feedback is provided around the op-amp so that the transformer secondary winding is connected across a virtual short, and the negative feedback tends to drive the voltage applied to the inputs of the operational amplifier to a very small value. To keep the voltage across the transformer secondary equal to zero, the negative feedback from the op-amp must tend to induce a current in the transformer secondary which essentially cancels the flux produced by current flowing in the primary. Since the flux through the transformer core is maintained at 0 or a small value regardless of the value of the input signal, non-linearities in the BH curve of the transformer have little or no effect on the output signal from the isolation amplifier.

DESCRIPTION OF THE DRAWINGS

These and other advantages of the present invention will become more clear upon the reading of the following detailed description of the invention in conjunction with the accompanying diagrams of which.

DETAILED DESCRIPTION OF THE INVENTION

Figure 1:
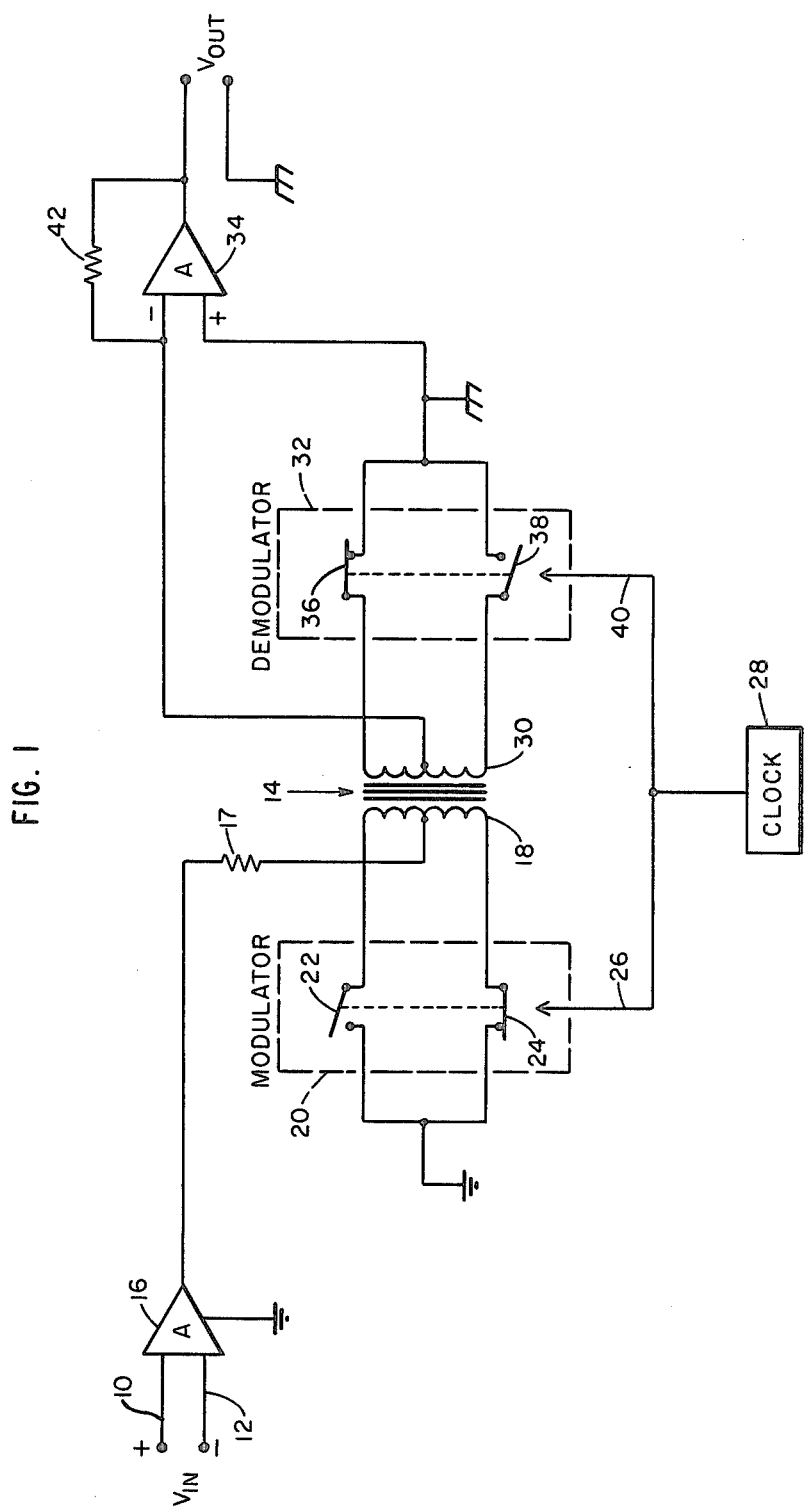
FIG. 1 is a block diagram of the isolation amplifier.

FIG. 1 is a block diagram of a transformer-type of isolation amplifier which illustrates the basic concepts of the present invention. Referring to FIG. 1, an input signal, denoted as $V_{IN}$, is provided along two wires 10 and 12. Typical signal sources include thermocouples and other types of low-level transducers. The input signal $V_{IN}$ is coupled through a transformer 14 to circuitry which provides the output signal as described below. Transformer 14 serves to electrically isolate the circuitry connected to the input signal source from the electronic signal processing circuitry.

The input signal $V_{IN}$ is typically applied to input amplifier circuitry denoted by differential amplifier 16 in FIG. 1. The output from amplifier 16 is connected to a center tap on the primary winding 18 of transformer 14 via a resistor 17 so that a current proportional to $V_{IN}$ flows in the primary winding 18. Each end of primary winding 18 is connected to a modulator circuit shown diagrammatically within dotted box 20 in FIG. 1. One type of modulator circuit consists of two switches 22 and 24, each connected to one end of primary winding 18. Switches 22 and 24 each have their second terminals connected to ground. In response to a signal applied to modulator 20 on line 26, switches 22 and 24 alternately open and close so that the output signal from amplifier 16 applied to the center tap of primary winding 18 is alternately returned to ground through opposite ends of primary winding 18. In this manner, a DC or low frequency signal applied to amplifier 16 is modulated at a higher frequency which allows it to be coupled from the primary winding of transformer 14 to the secondary winding.

The signal applied to the primary winding 18 by amplifier 16 and modulator circuitry 20 produces a flux in transformer 14, which is coupled to a secondary winding 30. Each end of secondary winding 30 is applied to a demodulator 32. A center tap from secondary winding 30 is applied to the inverting input of an op-amp 34. Similarly to modulator 20, the two ends of secondary winding 30 are connected to first terminals of two switches 36 and 38. The second terminals of switches 36 and 38 are connected to a common return point. Switches 36 and 38 alternately connect each end of secondary winding 30 to the common return in response to an input signal on line 40. In response to signals from clock 28, demodulator 32 synchronously demodulates the output signal from transformer 14, reconverting the AC-modulated input signal to a DC level which is applied to the input to output amplifier 34.

The non-inverting input to op-amp 34 is connected to ground, and the output of amplifier 34 is fed back to its inverting input via a resistor 42. Due to the negative feedback through resistor 42, the inverting input to amplifier 34 is a virtual ground, and the output of amplifier 34 will cause a current to flow through resistor 42 which will tend to cancel any voltage present across the differential inputs to amplifier 34. Since the signal applied to the input terminals to amplifier 34 is equal to the demodulated output from the secondary winding of transformer 14, the current produced by the negative feedback tends to cancel the signal present in secondary winding 30. In order for this condition to occur, the flux through the core of transformer 14 coupling the primary and secondary windings must also to go 0. Effectively, the negative feedback causes a current to flow through the secondary winding 30 of the transformer which results in an equal but opposite flux to the flux produced by primary winding 18. The net result is that the flux through the core of transformer 14 is reduced to 0 or a very low level, and the non-linearities in the transfer function of transformer 14 resulting from saturation of the core of the transformer are similarly reduced. In actual practice, the flux in the core of transformer 14 is never completely canceled, but rather is reduced by a value proportional to the amplification factor of op-amp 34. Typically, amplifier 34 is a very high gain amplifier, and the actual value of flux in the core of the transformer is so low that it can be ignored.

Figure 2:
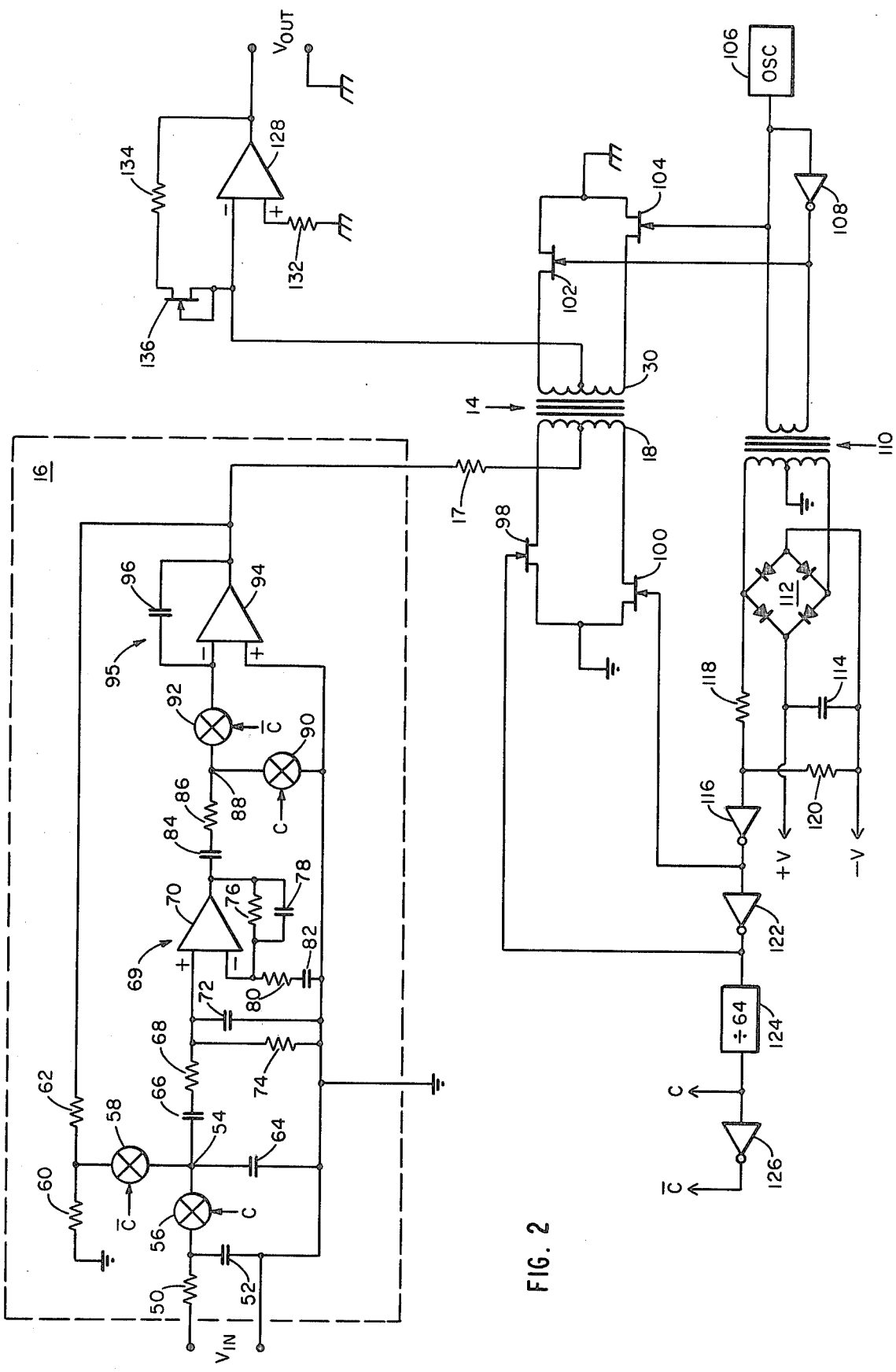
FIG. 2 is a schematic diagram of a preferred embodiment of the isolation amplifier of the present invention.

A schematic diagram is shown in FIG. 2 which illustrates one preferred embodiment of the present invention. An input signal $V_{IN}$ is applied to an input amplification stage shown within dotted box 16. Resistor 50 and capacitor 52 provide filtering of the input signal. The filtered input signal is selectively connected to a summing junction 54 via an electronic switch 56 controlled by a square wave signal denoted as "C" and produced as described below. A second electronic switch 58 controlled by a waveform denoted as "$\overline{C}$," the inverse of C, selectively connects summing junction 54 with a feedback signal present at the junction of resistors 60 and 62. A capacitor 64 between junction 54 and ground provides smoothing of the voltage transition at junction 54 as switches 56 and 58 are turned on and off.

The signal applied to node 54 by switch 58 is a feedback signal which is driven by amplifier 16 to follow the input signal $V_{IN}$. When the feedback signal controlled by switch 58 does not exactly equal the input signal $V_{IN}$, a voltage at node 54 is produced by the switching of switches 56 and 58, which voltage is a square wave having an amplitude equal to the difference in the input voltage and the feedback voltage. The square wave error voltage is coupled via a capacitor 66 to the following circuitry which eventually forces the feedback signal to the same voltage as the input signal. When the feedback signal and the input signal are equal, the voltage at node 54 remains constant as switches 56 and 58 turn on and off, and no error voltage is coupled via capacitor 66 to the following circuitry.

The error voltage from capacitor 66 is applied to the non-inverting input of an op-amp 70 via a resistor 68. A capacitor 72 between the non-inverting input of op-amp 70 and ground serves to filter the switching transients in the error signal introduced by switches 56 and 58. A relatively large value resistor 74 provides a DC path between the non-inverting input of op-amp 70 and ground to prevent this input from floating freely.

Op-amp 70 is connected as a non-inverting AC amplifier 69 by means of resistor 76 and capacitor 78 connected between the output of op-amp 70 and its inverting input, and resistor 80 and capacitor 82 connected between the inverting input of op-amp 70 and ground. The RC circuits made up of resistors 76 and 80 and capacitors 78 and 82 provide further filtering of the input signal to amplifier 69.

The output from amplifier 69 is applied to a capacitor 84 which is connected via a resistor 86 to node 88. Two electronic switches 90 and 92 selectively connect node 88 either to ground or to an integrator 95 composed of an op-amp 94 and a capacitor 96. Switch 90 connected between node 88 and ground is controlled by the C waveform, and switch 92 connecting node 88 with the integrator is controlled by $\overline{C}$ waveform. Thus, switches 90 and 92 switch synchronously with switches 56 and 58. The output from integrator 95 is applied to a resistive divider made up of resistors 60 and 62 to provide the feedback signal described above. The output of integrator 95 also provides the output signal from input amplifier circuit 16.

The operation of the input amplifier is as follows. As switches 56 and 58 alternately connect the input signal and the feedback signal to node 54, a square wave signal having an amplitude equal to the difference between the input signal and the feedback signals is coupled through capacitor 66 and applied to amplifier stage 69. This square wave signal appears at the output of amplifier 69 and is applied to capacitor 84. Switches 90 and 92 switch synchronously with inputs signals 56 and 58. Thus, during one phase of the square wave error signal applied to capacitor 84 by amplifier 69, the other terminal of capacitor 84 is connected to ground through resistor 86 via switch 90; and capacitor 84 is charged to a first voltage. During the second state of the square wave, the voltage applied to capacitor 84 from amplifier 69 is changed by a value proportional to the error signal present at node 54. The second terminal of capacitor 84 is connected through resistor 86 by switch 92 to the input of integrator 95, which is a virtual ground. Thus, a charge proportional to the amplitude of the square wave error signal present at the output of amplifier 69 will be dumped into the input node of integrator 95, causing the integrator output voltage to vary in a direction which tends to lessen the error signal. In this manner, the output signal from amplifier stage 16 is forced to follow the input voltage.

The output signal from amplifier stage 16 is applied to the center tap of the primary winding 18 of a transformer 14 via a series resistor 17. This signal is essentially a DC signal, as described above, and is modulated via two FET switches 98 and 100 connecting the ends of primary windings 18 to ground. The modulated signal appears across the secondary winding 30 of transformer 14. Two FET switches 102 and 104 operate synchronously with FET switches 98 and 100 and alternately connect either end of primary winding 30 to a common return point to provide a demodulated DC signal at the center tap of secondary winding 30.

In the preferred embodiment shown in FIG. 2, the modulation signals controlling FET switches 98 and 100 and power for the electronics directly connected to the input signal $V_{IN}$ are provided in the following manner. An oscillator 106 and inverter 108 provide complementary square wave signals which are applied to FET switches 102 and 104 to demodulate the signal coupled through transformer 14. These signals are also applied to the primary winding of a second transformer 110. The secondary winding of transformer 110 has a center tap connected to ground and either end to a diode bridge rectifier 112. Rectifier 112 provides a DC voltage which is filtered by a capacitor 114 and used to power the electronics connected to the primary side of transformer 14.

An AC signal is taken from one end of the secondary of transformer 110 and applied to a buffer inverter 116 via a voltage divider made up of resistors 118 and 120. The output of inverter 116 is applied to a second inverter 122; and the output from inverters 116 and 122 provide complementary modulation signals in synchronism with the output from oscillator 106. These complementary signals are used to drive the FET switches 98 and 100 which modulate the signal from amplifier 16 applied to the primary of transformer 14. The output from inverter 122 is also applied to a counter 124 which divides the modulation signal frequency down to a lower frequency. Typically, counter 124 is a six-bit counter which provides an output frequency 1/64 of the input frequency. The output signal from divider 124, and its complement provided by an inverter 126, provide the C and $\overline{C}$ signals used to drive switches 56, 58, 90 and 92 in amplifier 16.

The demodulated DC voltage taken from the center tap of transformer 14 is applied to the inverting input of an op-amp 128. The inverting input of op-amp 128 is connected to ground via a resistor 132. The output of op-amp 128 is fed back to its inverting input via a resistor 134 and an FET 136. The source and gate of FET 136 are connected, and FET 136 provides temperature compensation for variations in the resistance of demodulator FET's 102 and 104 and the resistance of the secondary winding 30 of transformer 14.

As described above in connection with FIG. 1, the voltage present at the center tap of secondary winding 30 of transformer 14 is forced to remain at 0 due to the negative feedback around op-amp 128. In order for this condition to exist, the flux through the core of transformer 14 must also be forced to 0. This occurs in the following manner. A flux is produced in the core of transformer 14 by the modulated current flowing through the primary winding 18. The output voltage from secondary winding 30 is applied to the input of op-amp 128 and is forced to 0 by the operation of op-amp 128. In order to fulfill the above-stated requirement of no flux in the core of transformer 14, a current of equal magnitude (assuming a turns ratio of 1:1 for transformer 14) but opposite polarity must flow through the secondary winding 30 of transformer 14 to cancel the flux produced by the current flowing through the primary winding 18. Thus, the output voltage of op-amp 128 will change such that a current is provided through feedback resistor 134 of equal magnitude and opposite polarity to the current flowing through primary winding 18. This output voltage from op-amp 128 provides the isolation amplifier output signal. Since this output signal is provided by nulling the flux in the core of transformer 14, non-linearities in the output signal caused by non-linearities in the BH curve of the core of transformer 14 are avoided.

There has been described a unique isolation amplifier having numerous advantages over such amplifiers previously known. It should be appreciated that modifications may be made by those or ordinary skill in the art in applying the teachings of the present invention to different applications. Accordingly, a disclosure therein of a preferred embodiment is for purposes of example, and the invention is only to be limited as indicated in the accompanying claims.

We claim:
1. An isolation amplifier comprising:
   an input amplifier having first and second input terminals for receiving an input signal applied thereto and operative to provide an amplified signal proportional to the input signal;
   a transformer having a center tapped primary winding, a center tapped secondary winding and a core magnetically coupling the primary and secondary windings;
   means coupling said amplified signal to the center tap of said primary winding;
   a modulator circuit connected to the primary winding for alternately applying the amplified signal to opposite sections of the primary winding;
   a differential output amplifier having an inverting input terminal coupled to the center tap of the secondary winding and a non-inverting input terminal coupled to a common return point;
   a negative feedback path from the output to the inverting input of the output amplifier providing a current through the secondary winding which tends to force the net flux through the transformer core to zero;
   a demodulator circuit connected to the secondary winding for alternately connecting each end of the secondary winding to the commn return point to demodulate the output signal from the center tap of the secondary winding;
   the output amplifier providing an output signal representative of the input signal and electrically isolated from the input terminals; and
   clock means coupled to said modulator and demodulator and operative to control the operation thereof.

2. The isolation amplifier of claim 1 wherein said output amplifier includes a high gain operational amplifier having a resistive feedback path connected from the output thereof to the inverting input thereof.

3. The isolation amplifier of claim 2 wherein the feedback path of the output amplifier includes an element providing temperature compensation for variations in the resistance of components in the demodulator and in the secondary winding of the transformer.

4. The isolation amplifier of claim 1 wherein said input amplifier includes a chopper amplifier providing the amplifier input signal.

5. The isolation amplifier of claim 4 wherein said clock means includes:
   oscillator means providing complementary timing signals;
   means for applying said complementary timing signals to said demodulator circuit for controlling the operation thereof;
   means operative in response to said timing signals to provide complementary modulation signals coupled to said modulator circuit to control the operation thereof; and
   means operative in response to said modulation signals to provide complementary clock signals for controlling the operation of said chopper amplifier.

* * * * *